United States Patent [19]

Lowrey et al.

[11] Patent Number: 5,177,027

[45] Date of Patent: Jan. 5, 1993

[54] PROCESS FOR FABRICATING, ON THE EDGE OF A SILICON MESA, A MOSFET WHICH HAS A SPACER-SHAPED GATE AND A RIGHT-ANGLED CHANNEL PATH

[75] Inventors: Tyler A. Lowrey; Randal W. Chance; D. Mark Durcan; Pierre C. Fazan; Fernando Gonzalez; Gordon A. Haller, all of Boise, Id.

[73] Assignee: Micron Technology, Inc., Boise, Id.

[21] Appl. No.: 569,353

[22] Filed: Aug. 17, 1990

[51] Int. Cl.⁵ .................... H01L 21/336; H01L 21/28
[52] U.S. Cl. .......................................... 437/41; 437/44; 437/38; 437/186; 257/328; 257/623
[58] Field of Search .............. 437/40, 41, 34, 56, 437/57, 58, 44, 27, 30, 38, 186; 357/56, 23.4, 42, 44

[56] References Cited

U.S. PATENT DOCUMENTS

| | | | |
|---|---|---|---|
| 4,359,816 | 11/1982 | Abbas et al. | 437/228 |
| 4,464,212 | 8/1984 | Bhatia et al. | 357/51 |
| 4,466,175 | 8/1984 | Coe | 437/44 |
| 4,650,544 | 3/1987 | Erb et al. | 437/228 |
| 4,670,768 | 6/1987 | Sunami et al. | 357/23.4 |
| 4,698,654 | 10/1987 | Kohn | 357/56 |
| 4,758,528 | 7/1988 | Golh et al. | 437/228 |
| 4,851,889 | 7/1989 | Matsuzaki | 357/56 |
| 4,859,622 | 8/1989 | Eguchi | 437/228 |
| 4,920,065 | 4/1990 | Chin et al. | 437/228 |
| 4,941,026 | 7/1990 | Temple | 357/23.4 |
| 4,982,258 | 1/1991 | Baliga | 357/23.4 |
| 5,001,526 | 3/1991 | Gotou | 357/23.4 |
| 5,010,386 | 4/1991 | Groover, III | 357/23.4 |

FOREIGN PATENT DOCUMENTS

| | | | |
|---|---|---|---|
| 0098111 | 1/1984 | European Pat. Off. | 437/57 |
| 0145567 | 6/1985 | European Pat. Off. | 357/56 |
| 0200576 | 11/1983 | Japan | 437/44 |
| 0097970 | 5/1986 | Japan | 437/44 |

OTHER PUBLICATIONS

Hochberg et al., "Fabrication of MOS Devices with Close Source-Drain Spacing", IBM Technical Disclosure Bulletin, vol. 10, No. 5, Oct. 1967, pp. 653-654.

Ghandhi, *VLSI Fabrication Principles*, John Wiley & Sons, 1983, pp. 575-576.

Nicky C. C. Lu, "Advanced Cell Structures for Dynamic RAMG" IEEE Circuits and Devices Magazine, Jan. 1989, pp. 27-36.

*Primary Examiner*—Mary Wilczewski
*Attorney, Agent, or Firm*—Angus C. Fox, III

[57] ABSTRACT

A process for fabricating, on the more or less vertical edge of a silicon mesa, a MOS field-effect transistor which has a spacer-shaped gate and a right-angled channel path. The process involves the following steps: creating a raised region (the mesa) on a planar silicon substrate; creation of a gate oxide layer on the substrate and vertical sidewalls of the mesa; blanket deposition of a gate layer (typically polysilicon); anisotropically etching the gate layer to expose the upper surface of the mesa and leave a stringer gate around the circumference thereof; and doping the upper surface of the mesa and regions of the substrate peripheral to the circumferential polysilicon stringer to create source and drain regions. The standard process provides device density approximately double that of standard FET fabrication processes. Density can be increased even further by increasing the number of silicon mesas with a minimum pitch distance. This may be accomplished by employing the reduced-pitch masking technique disclosed in a copending U.S. patent application. Multiple transistors may be created on a single mesa by creating isolation regions within the mesa. The circumferential gate may be severed so as to provide a pair of gate inputs for transistors created on a single mesa. Enhancements common to conventional MOSFETS, such as lightly-doped source and drains, halos, etc., may be utilized for the new MOSFET process.

10 Claims, 9 Drawing Sheets 5,177,027

PROCESS FOR FABRICATING, ON THE EDGE OF A SILICON MESA, A MOSFET WHICH HAS A SPACER-SHAPED GATE AND A RIGHT-ANGLED CHANNEL PATH

FIELD OF THE INVENTION

This invention relates to semiconductor fabrication process technology and, more specifically, to processes for fabricating MOS field-effect transistors which employ vertical, thin-layer segments for gates.

BACKGROUND OF THE INVENTION

Since the late 1960s, a new generation of integrated circuits has been developed approximately every four years. Each generation has been characterized by roughly a 30 percent reduction in device dimensions, resulting in a two-fold density increase over the preceding generation. Increases in circuit density have been consistently limited by the resolution of the available photolithographic equipment. The minimum size of features and spaces that a given piece of photolithographic equipment can produce is directly related to its resolution capability. The sum of minimum feature width (F) and minimum space width (S) producible with a given piece of photolithographic equipment is referred to in this disclosure as "minimum pitch". Since, for practical purposes, F can be considered to be equal to S, minimum pitch is, therefore, approximately equal to double the minimum feature width, or 2F. Using contemporary photolithography techniques, one line (feature) and one space may be defined for a given minimum pitch.

It has long been recognized, by those skilled in the fabrication of integrated circuits, that vertical layers as thin as 0.01 μM can be grown with a high degree of accuracy. By comparison, the minimum feature size, producible with the present generation of photolithography equipment used to produce 1-megabit SRAMs and 4-megabit DRAMs, is approximately 0.7 μm. Therefore, utilizing contemporary equipment in conjunction with contemporary photolithography techniques, approximately 1.4 μm (the minimum pitch) is required to define one line and one space.

Isolated vertical layer segments may be formed by depositing an expendable layer on a substrate, masking and etching the expendable layer down to the substrate such that expendable layer remnants having vertical sidewalls are created, blanket depositing a thin spacer layer over the substrate and expendable layer remnants, performing an anisotropic etch to create vertical, thin-layer segments (in the form of spacer strips) on the sidewalls of the expendable layer, and then etching away the expendable layer remnants to leave the spacer strips. In the early 1980s, Seiki Ogura, Christopher F. Codella, Nivo Rovedo, Joseph F. Shepard and Jacob Riseman of IBM Corp. used this technique to create a half-micron-width gate for an insulated-gate field-effect transistor (IGFET).

If a process could be devised in which IGFETs (also commonly, but inaccurately, called MOSFETs) could be fabricated on both longitudinal vertical edges of rectangularly-shaped mesas (raised islands of silicon) using a spacer etch to create the gates thereof, circuit density could be increased dramatically by a factor of at least two.

SUMMARY OF THE INVENTION

The present invention constitutes a process for fabricating MOS field-effect transistors on the more or less vertical edge of a silicon mesa. A circumferential stringer or spacer strip, created with an anisotropic spacer etch, functions as the gate of one or multiple transistors that have been incorporated in the mesa. The channel path of each transistor is essentially a right angle. Because gate length is determined principally by the length of the vertical segment, a pair of MOSFETs may be created within a horizontal distance that is equal to the minimum pitch of available photolithography. The number of MOSFETS per minimum feature width may be increased dramatically by multiplying by $2^N$ (where $N = 1, 2, 3 \ldots$) the number of silicon mesas within the minimum pitch distance. This may be accomplished by employing the reduced-pitch masking technique disclosed in a copending U.S. patent application submitted by Tyler Lowrey and Randal Chance, entitled "Method for Reducing by $2^{-N}$ the Minimum Masking Pitch of a Photolithographic Process Used in the Fabrication of an Integrated Circuit", and accorded Ser. No. 07/519,992, now abandoned.

Transistors fabricated using this process may used in a variety of functions (e.g., as access transistors for DRAM cells, as building blocks of SRAM circuitry, sense-amp circuitry, etc.)

In its most basic form, the process involves the following steps: creating a raised region (hereinafter referred to as a mesa) on a planar silicon substrate, said mesa having a substantially horizontal upper surface and substantially vertical sidewalls; creation of a gate oxide layer on the substrate and vertical sidewalls of the mesa; blanket deposition of a gate layer (typically polycrystalline silicon); anisotropically etching the gate layer to expose the horizontal upper surface of the mesa and leave a stringer gate around the circumference of the mesa; and doping the upper surface of the mesa and regions of the substrate peripheral to the circumferential polycrystalline silicon (hereinafter also "polysilicon") stringer to create source and drain regions.

Using more complex variations of the process, multiple transistors may be created for ultra-dense circuit. For example, a pair of gates or (in the case of a DRAM array) a pair of wordlines may be constructed on opposite vertical edges of a rectangularly-shaped mesa having a width less than or equal to the minimum feature width producible with available photolithography. Device density may be further increased by creating a series of substantially parallel isolation regions within the semiconductor mesa, thus creating individual sources for multiple MOSFETs. The circumferential gate stringer may also be cut into several segments in order to provide separate inputs. In addition, other enhancements common to conventional MOSFETS, such as lightly-doped source and drains, halos, etc., may be utilized for the new MOSFET process.

PREFERRED EMBODIMENT OF THE INVENTION

Figure 1A:
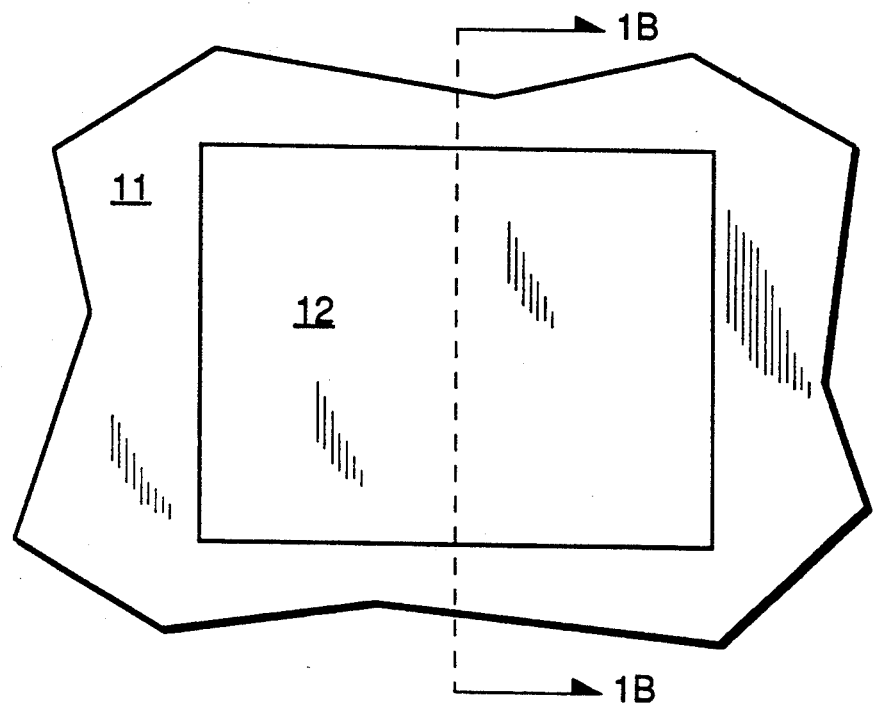
FIG. 1A is a top planar view of a portion of an in-process wafer, showing a silicon substrate masked by a rectangular photoresist strip.
Figure 1B:
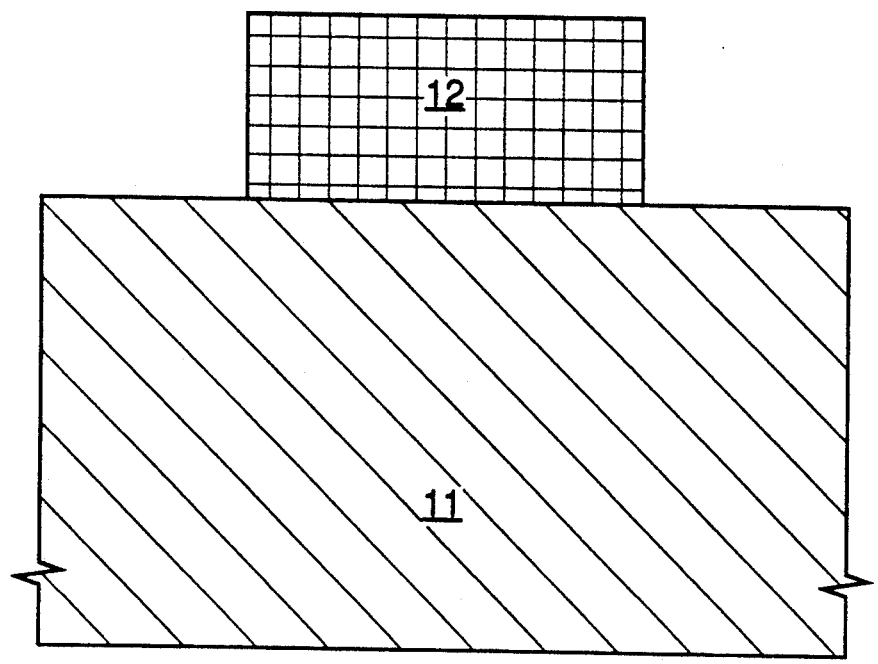
FIG. 1B is a cross-sectional view through broken line 1B—1B of FIG. 1A.

Referring now to FIG. 1A, the process for fabricating an N-channel MOSFET on the vertical edge of a silicon mesa begins by masking a lightly-doped P-type silicon substrate 11 with a rectangular photoresist strip 12. A cross-sectional view of the photoresist-masked substrate is shown in FIG. 1B. Although the fabrication of an N-channel transistor will be described, an equivalent process may be applied to the fabrication of a P-channel transistor. The only significant differences between the two processes are the use of a lightly-doped N-type substrate starter material and a reversal of types used for the N-channel device.

Figure 2:
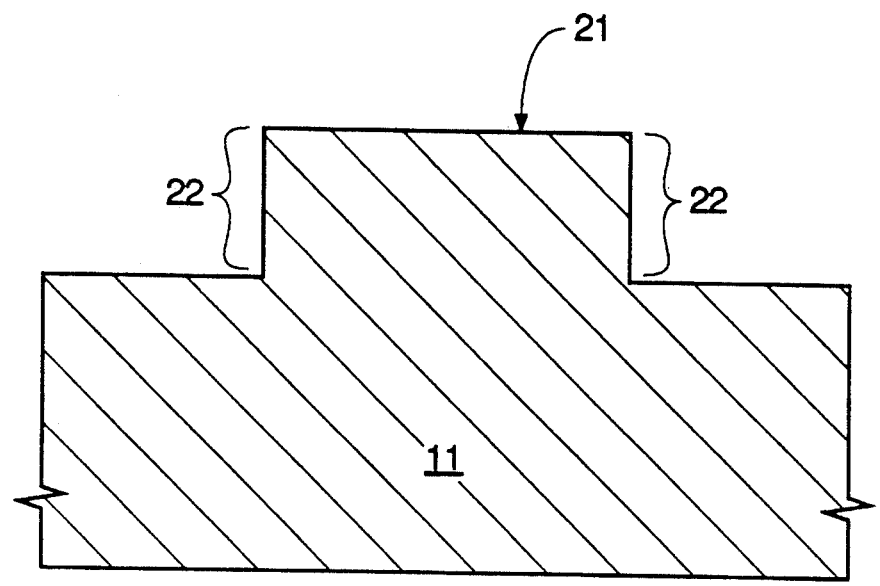
FIG. 2 is a cross-sectional view of the in-process wafer portion of FIG. 1B following an anisotropic silicon etch.

Referring now to FIG. 2, an anisotropic silicon etch has lowered the topography of the substrate that was not subjacent photoresist strip 12, thus creating a rectangular mesa 21 with substantially vertical side walls 22.

Figure 3:
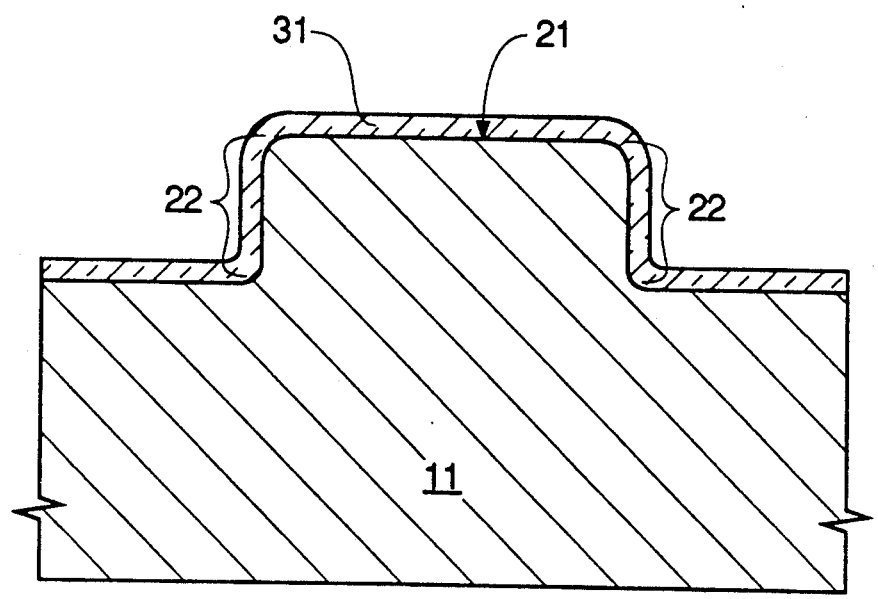
FIG. 3 is a cross-sectional view of the in-process wafer portion of FIG. 2 following the growth of a sacrificial oxide layer.

Referring now to FIG. 3, following a photoresist strip, an optional sacrificial oxide layer 31 is thermally grown on the surface of the substrate 11, smoothing the vertical walls 22 that may have been roughened by the anisotropic etch, radiusing the upper edge 31 and filleting the corners of mesa 21.

Figure 4:
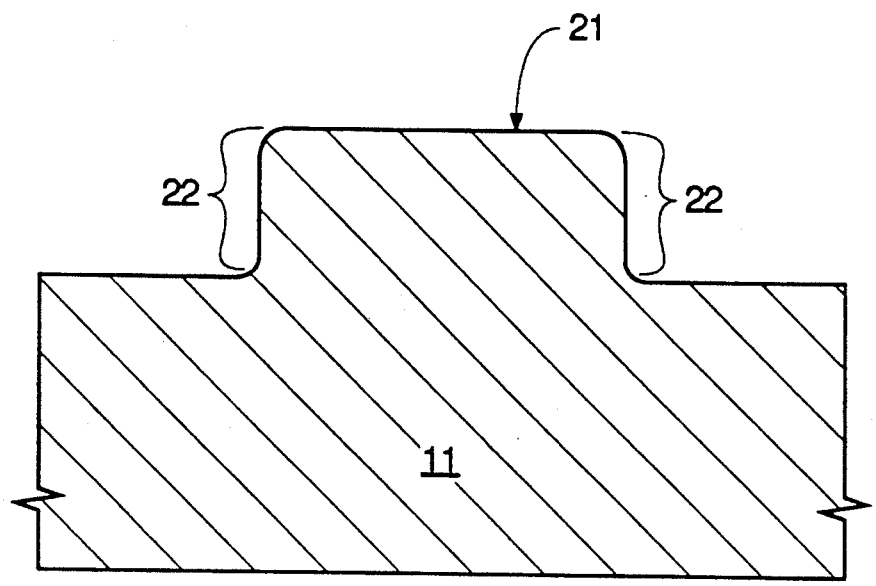
FIG. 4 is a cross-sectional view of the in-process wafer portion of FIG. 3 following the stripping of the sacrificial oxide layer with a wet oxide etch.

Referring now to FIG. 4, sacrificial oxide layer 31 has been stripped with a wet oxide etch.

Figure 5:
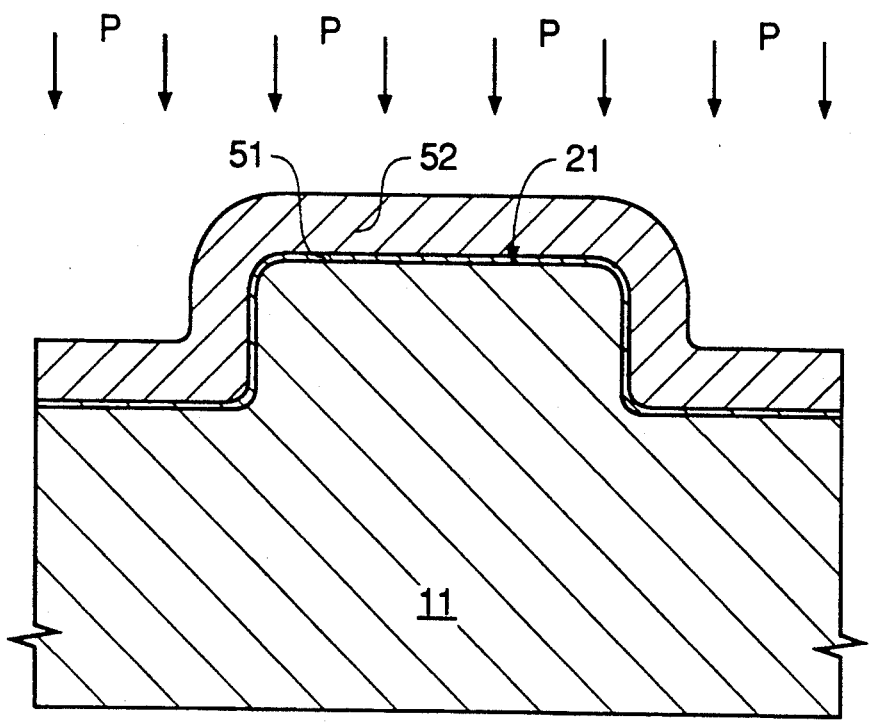
FIG. 5 is a cross-sectional view of the in-process wafer portion of FIG. 4 following the creation of a gate oxide layer, deposition of a polysilicon layer, and doping of the polysilicon layer.

Referring now to FIG. 5, a gate oxide layer 51 has been thermally grown on the surface of substrate 11 (including the top and sides of mesa 21). A conformal polysilicon layer 52 is then blanket deposited on the in-process wafer. Polysilicon layer 52 may be either in-situ doped or doped following deposition. Phosphorus is considered to be the optimum dopant impurity for the doping of N-channel device gates, although arsenic and even P-type dopants will work nearly as well.

Figure 6:
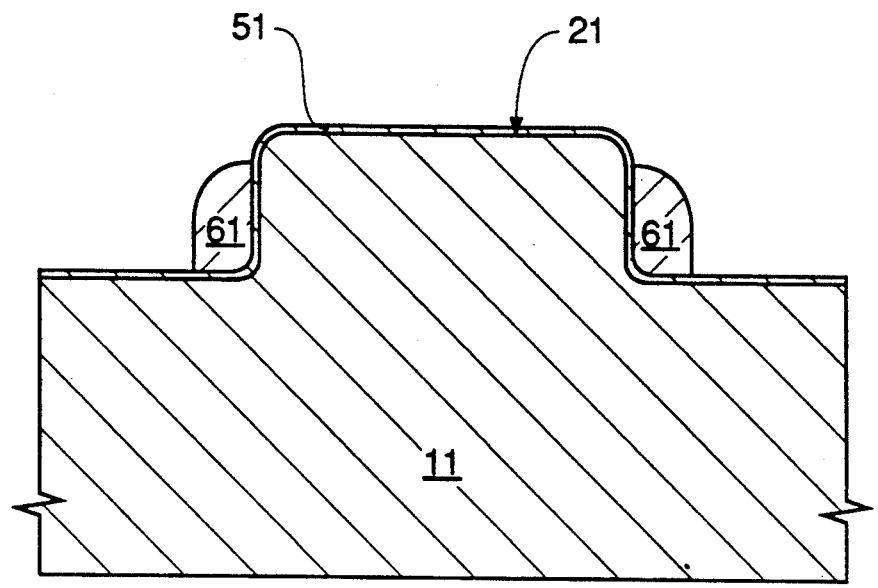
FIG. 6 is a cross-sectional view of the in-process wafer portion of FIG. 5 following an anisotropic etch of the polysilicon layer.

Referring now to FIG. 6, conformal polysilicon layer 52 has been anisotropically etched to create a circumferential stringer gate 61 adjacent the vertical wall of mesa 21.

Figure 7:
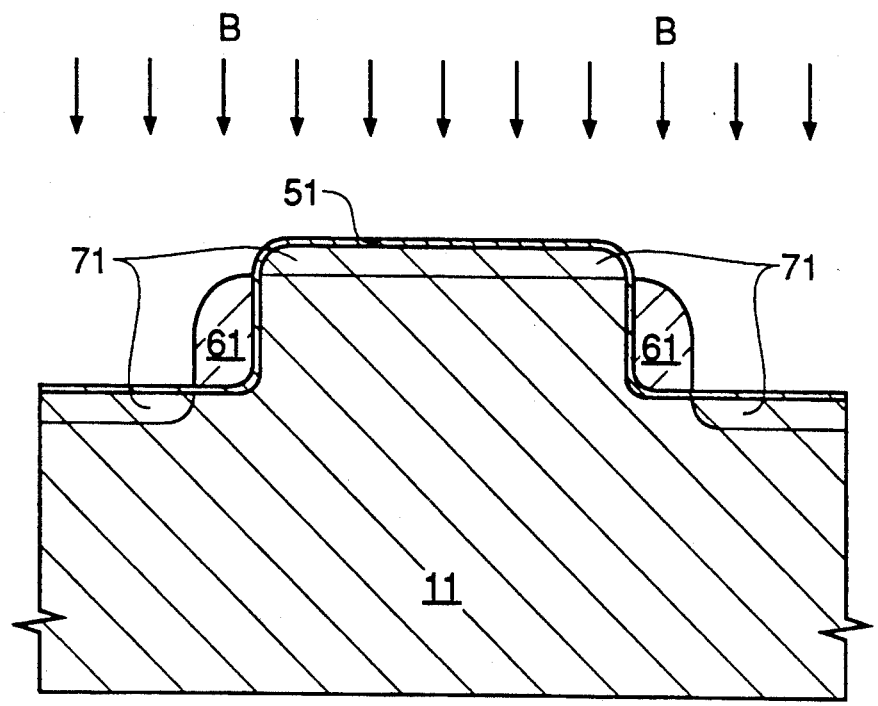
FIG. 7 is a cross-sectional view of the in-process wafer portion of FIG. 6 following an optional low-dosage, boron anti-punch-through halo implant perpendicular to the wafer surface.

Referring now to FIG. 7, an optional unmasked, low-dosage, boron anti-punchthrough halo implant, perpendicular to the wafer surface, creates punch-through-resistant regions 71.

Figure 8:
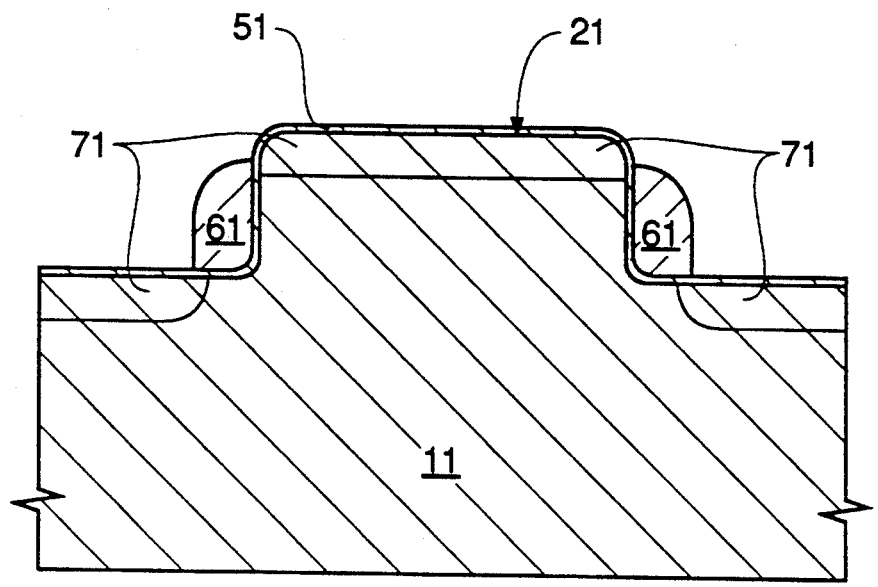
FIG. 8 is a cross-sectional view of the in-process wafer portion of FIG. 7 following a first elevated-temperature drive step.

Referring now to FIG. 8, a first elevated-temperature drive step causes the boron in punchthrough-resistant regions 71 to diffuse under the edges of transistor gate 61.

Figure 9:
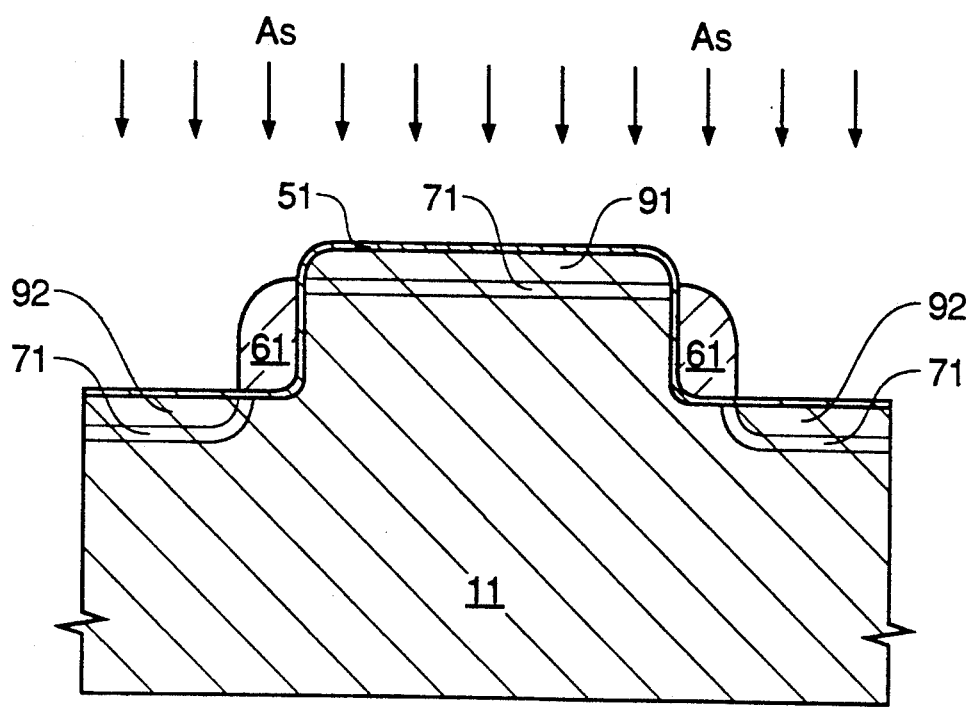
FIG. 9 is a cross-sectional view of the in-process wafer portion of FIG. 8 following an arsenic source/drain implant perpendicular to the wafer surface.

Referring now to FIG. 9, a high-dosage arsenic implant perpendicular to the wafer surface creates heavily-doped source regions 91 and heavily-doped drain regions 92.

Figure 10:
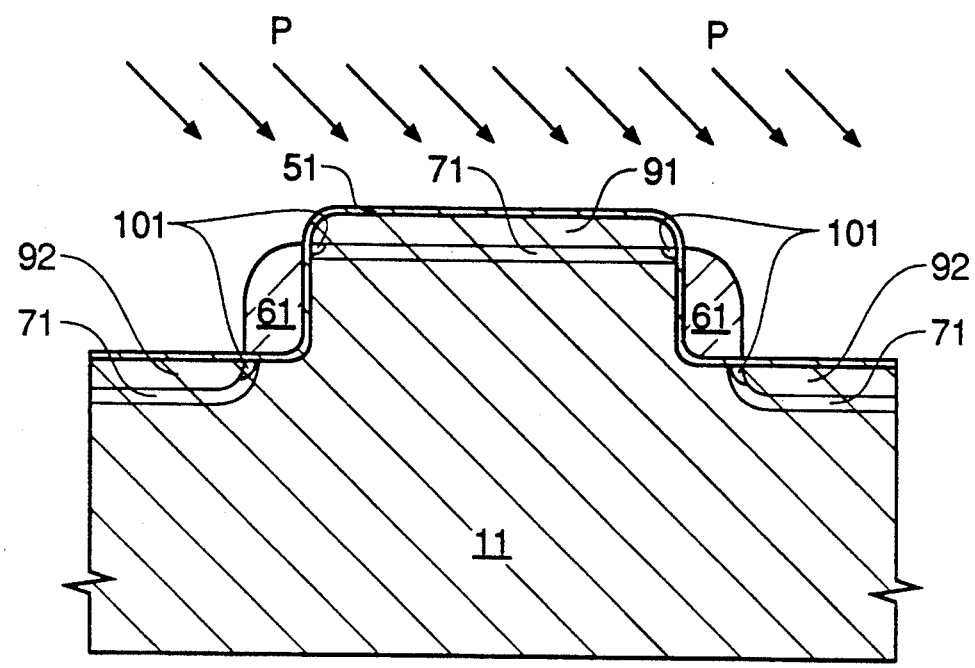
FIG. 10 is a cross-sectional view of the in-process wafer portion of FIG. 9 following an angled low-dosage phosphorus source/drain implant during wafer rotation.

Referring now to FIG. 10, an optional low-dosage phosphorus implant angled at approximately 45 degrees, performed during wafer rotation, creates lightly-doped source regions 101 and lightly-doped drain regions 102. This angled implant may be replaced with a perpendicular phosphorus implant performed at an energy level optimized for best punchthrough and hot-electron transistor performance.

Figure 11:
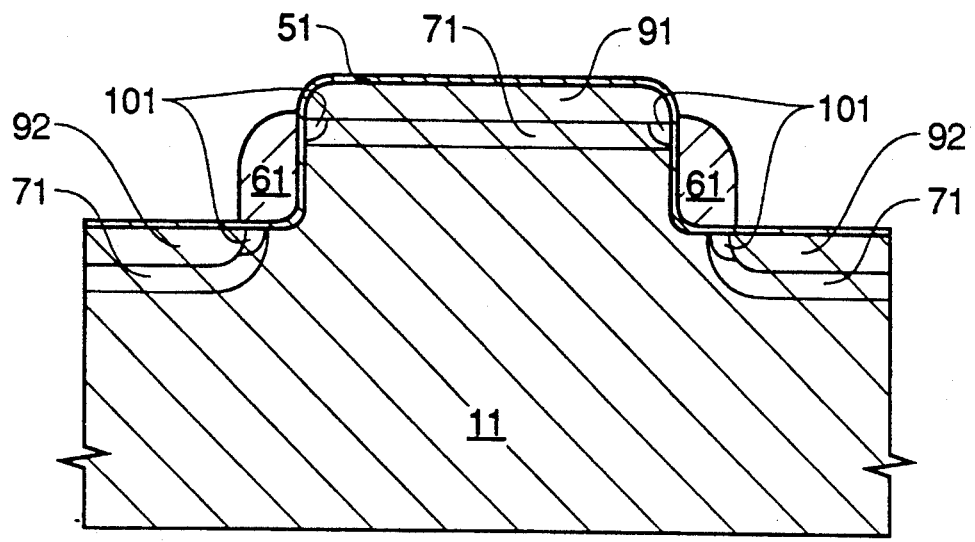
FIG. 11 is a cross-sectional view of the in-process wafer portion of FIG. 10 following a second elevated-temperature drive step.

Referring now to FIG. 11, the in-process wafer is subjected to a second elevated temperature drive step which causes diffusion of all implants farther beneath the edges of transistor gates 61. Boron diffuses most rapidly, while arsenic diffuses most slowly.

Figure 12:
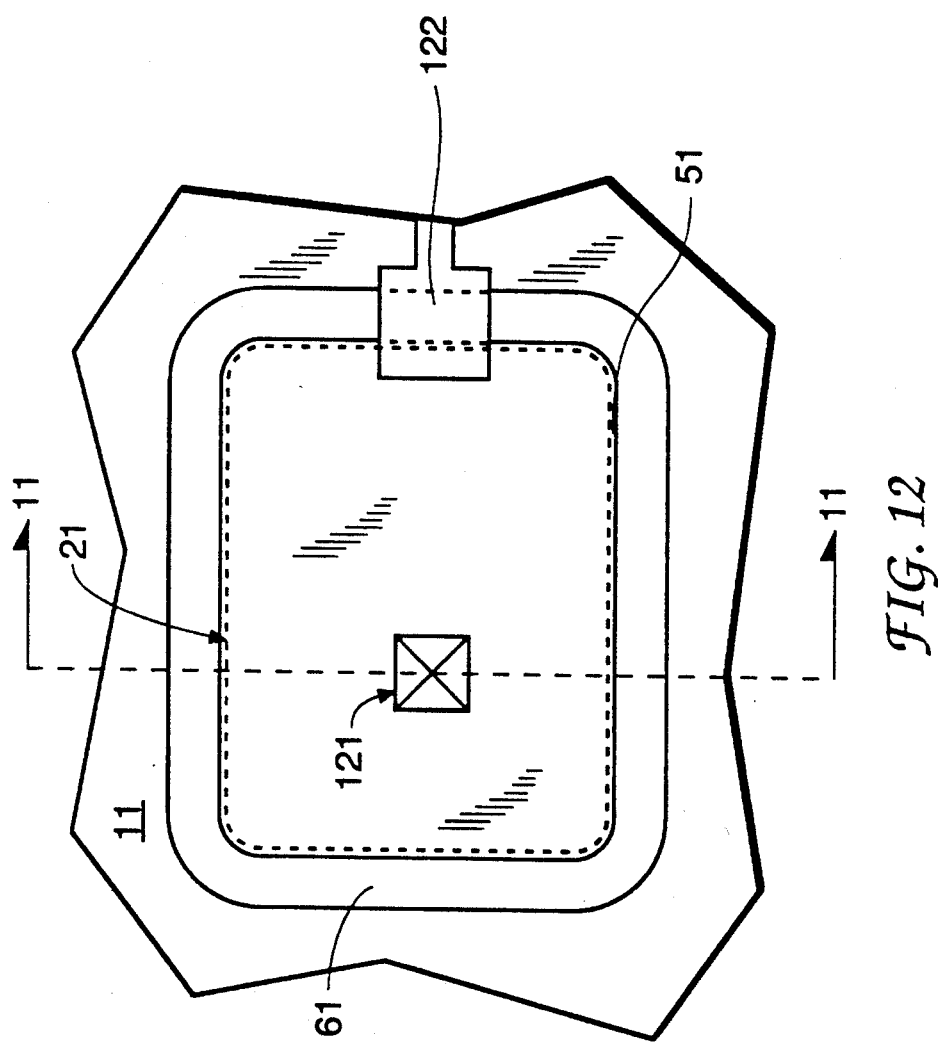
FIG. 12 is a top plan view of the completed stringer MOSFET of FIG. 11, with line 11—11 showing the line through which the cross-sectional view of the previous figure was made; also shown is an X-marked region where electrical contact will be made on top of the mesa; further shown is a structure which makes electrical connection between the stringer gate and the drain.

Referring now to the top planar view of FIG. 12, a completed stringer MOSFET is depicted. The square with the "X" 121 represents the regions where contact will be made via a conductive line to heavily-doped drain region 92. Contact with stringer gate 61 may be made using a variety of techniques. One technique, shown in this view, involves the deposition of a patch 122 of conductive material, which makes contact only with gate 61, being insulated from the source/drain regions on either side of gate 61 by gate oxide layer 51.

Figure 13:
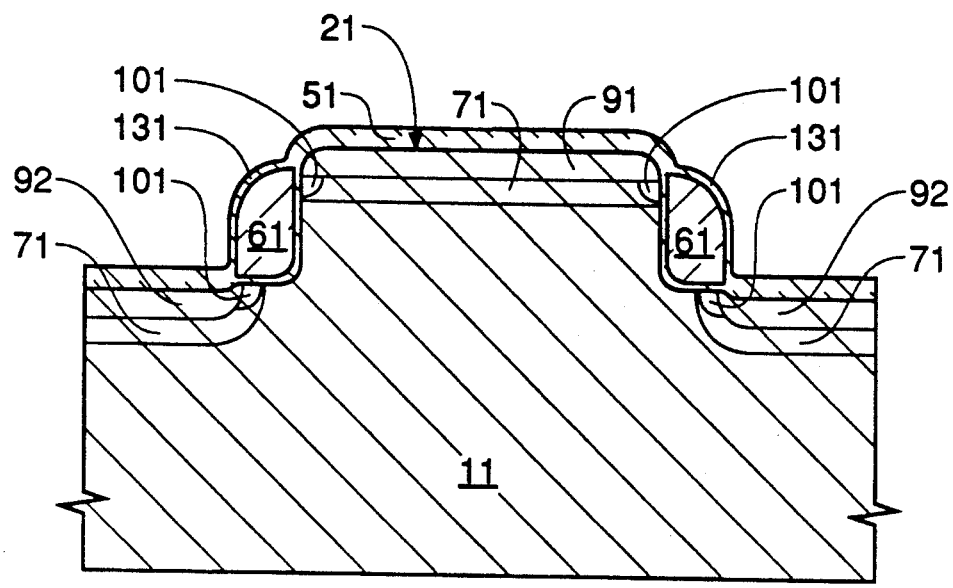
FIG. 13 is a cross-sectional view of the in-process wafer portion of FIG. 11 following an optional thermal reoxidation step.

Referring now to FIG. 13, an optional thermal reoxidation step has repaired any damage sustained by gate oxide layer 51 during the anisotropic etch that created stringer gate 61, and has resulted in the growth of a surface oxide layer 131 on gate 61.

Figure 14:
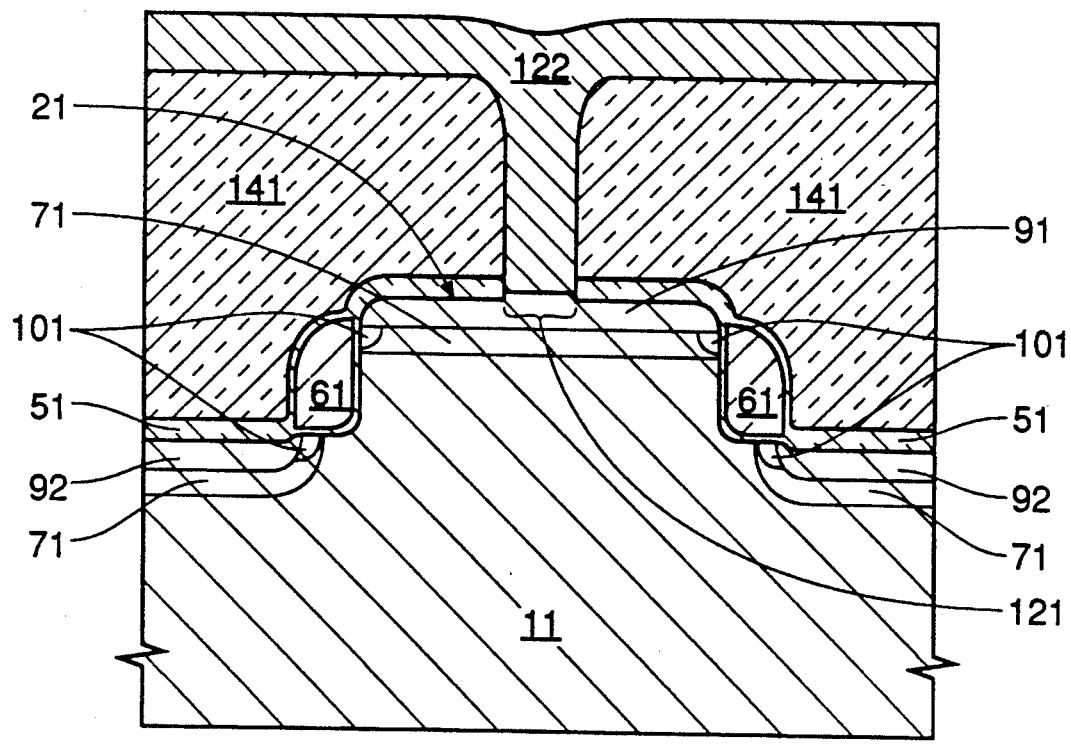
FIG. 14 is a cross-sectional view of the in-process wafer portion of FIG. 13 following deposition of a TEOS oxide layer, planarization of the TEOS layer, opening of a contact through the TEOS layer to the source of the transistor, and metalization in order to form a contact thereto.

Referring now to FIG. 14, a TEOS oxide layer 141 has been deposited and planarized, after which a contact opening through TEOS layer 141 to heavily-doped source region 91 was made with a contact mask and etch. A metalization step has created metal contact 142.

Multiple transistors may be created on each side of a mesa. A conventional or modified LOCOS process may be employed to create isolation regions which intersect mesa 21 through its longitudinal axis, thus isolating ribbons of silicon which run through the substrate on one side of the mesa, up an adjacent vertical sidewall of the mesa, across its top, down an opposing vertical sidewall, and into the substrate adjacent the opposing vertical sidewall. A similar result may be achieved by etching a mesa from alternating slices of silicon and oxide (or other insulative material). Such a repeating silicon-oxide pattern may be fabricated by trenching a silicon substrate, filling the trenches with oxide using chemical vapor deposition, then planarizing the surface back to the level of the substrate.

Figure 15:
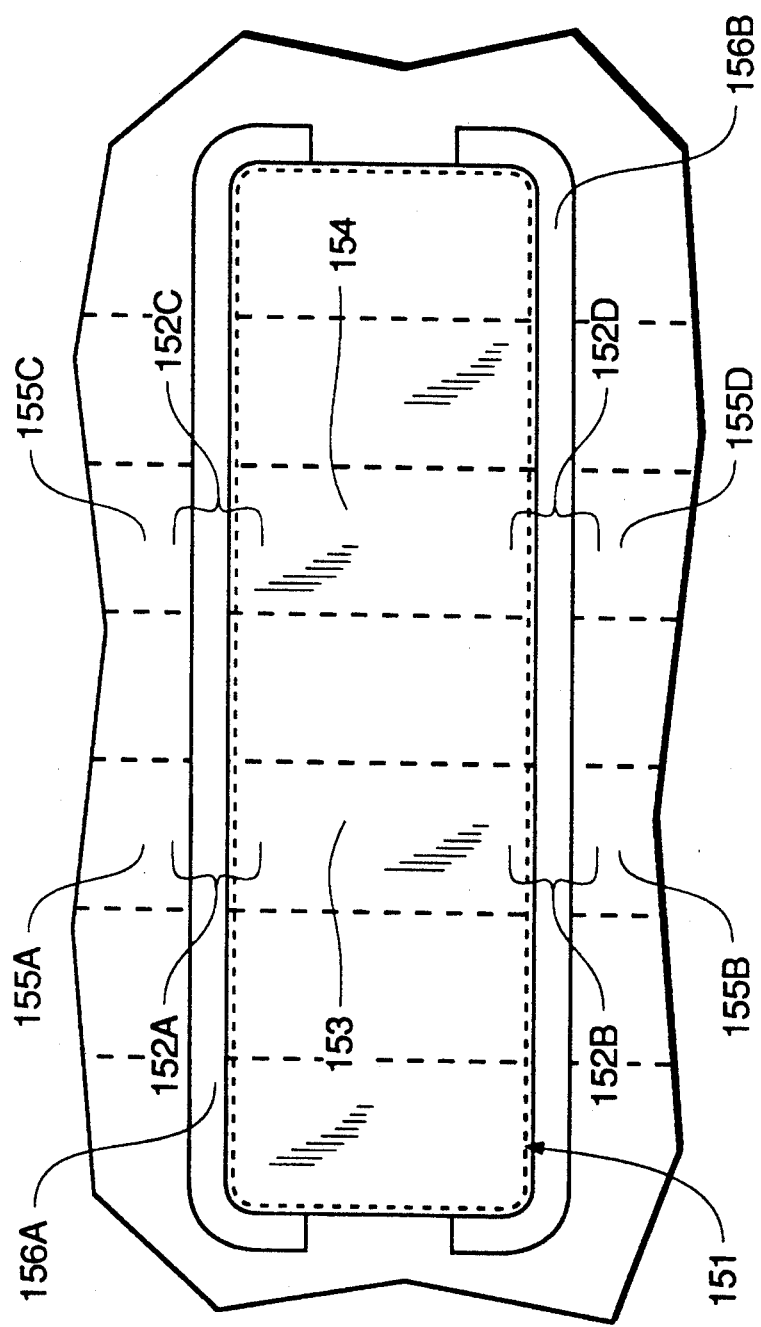
FIG. 15 depicts a mesa on which two pairs of transistors with spacer-shaped gates and right-angled channel paths have been constructed back-to-back.

FIG. 15 depicts a mesa 151 on which two pair of transistors with spacer-shaped gates and right-angled channel paths have been constructed back-to-back. Transistors 152A and 152B share common drain 153, while transistors 152C and 152D share common drain 154. Each of the four transistors has its own source, 155A, 155B, 155C, and 155D, respectively. Stringer gate 156 has been served at each end of the mesa such that transistors 152A and 152C share stringer gate 156A, while transistors 152B and 152D share stringer gate 156B. Contact with each stringer gate 156A and 156B may be made at opposite ends of mesa 151.

A more detailed description of the process for fabricating multiple transistors on a single mesa, including interconnect construction, may be found in copending U.S. patent application Ser. No. 07/555,980 (no serial number has yet been assigned) entitled "Process for Fabricating a DRAM Array Having Feature Widths that Transcend the Resolution Limit of Available Photolithography". The process, developed by Tyler Lowrey, Randal Chance, Mark Durcan, Ruojia Lee, Charles Dennison, Yauh-Ching Liu, Pierre Fazan, Fernando Gonzalez and Gordon Haller (all of Micron Technology, Inc.), utilizes a reduced-pitch masking process to quadruple circuit density.

Although only several embodiments of the transistor fabrication process have been described herein, it will be apparent to those having ordinary skill in the art, that changes may be made thereto without departing from the spirit and the scope of the process as claimed.

We claim:

1. A process for fabricating multiple insulated-gate field-effect transistors on the edge of a mesa, said process comprising the following sequence of steps:
   creating one or more trenches within a substantially planar silicon substrate;
   filling said trenches with an insulative material;
   masking with photoresist a portion of the substrate, said portion being intersected by said insulative-material-filled trenches;
   anisotropically etching said portion of the substrate to create a raised mesa that is subjacent the photoresist, said mesa having a substantially horizontal upper surface and substantially vertical sidewalls;
   stripping the photoresist;
   creating a gate oxide layer on silicon regions of the mesa and surrounding etched regions of the substrate;
   blanket deposition of a conformal gate layer;
   anisotropically etching the gate layer to expose the upper surface of the mesa and leave a stringer gate around the circumference thereof;
   doping silicon regions on the upper surface of the mesa and silicon regions of the substrate peripheral to the circumferential polysilicon stringer to create source and drain regions.

2. The process of claim 1 wherein said trenches are filled with insulative material using a chemical vapor deposition process.

3. The process of claim 2 wherein excess insulative material is removed with a planarization step.

4. The process of claim 1, wherein said insulative material is silicon dioxide.

5. The process of claim 1 wherein said gate layer is polycrystalline silicon.

6. The process of claim 5 which further comprises the step of conductively doping the gate layer.

7. The process of claim 1, wherein said gate oxide layer is thermally grown.

8. The process of claim 1, which further comprises the step of severing said stringer gate at two or more points in its circumference.

9. The process of claim 1, wherein said mesa, when viewed in a planar perspective is rectangular in shape.

10. The process of claim 1, wherein said isolation regions are essentially parallel to one another.

* * * * *